United States Patent
Kong et al.

(10) Patent No.: US 11,137,854 B2
(45) Date of Patent: Oct. 5, 2021

(54) DISPLAY DEVICE WITH SHIFT REGISTER COMPRISING NODE CONTROL CIRCUIT FOR Q AND QB NODE POTENTIALS AND RESET CIRCUIT

(71) Applicant: LG Display Co., Ltd., Seoul (KR)

(72) Inventors: Chung Sik Kong, Paju-si (KR); Han In Cho, Incheon (KR)

(73) Assignee: LG Display Co., Ltd., Seoul (KR)

( * ) Notice: Subject to any disclaimer, the term of this patent is extended or adjusted under 35 U.S.C. 154(b) by 31 days.

(21) Appl. No.: 15/328,884

(22) PCT Filed: Jul. 30, 2015

(86) PCT No.: PCT/KR2015/008006
§ 371 (c)(1),
(2) Date: Jan. 24, 2017

(87) PCT Pub. No.: WO2016/018105
PCT Pub. Date: Feb. 4, 2016

(65) Prior Publication Data
US 2017/0213499 A1    Jul. 27, 2017

(30) Foreign Application Priority Data

Jul. 31, 2014 (KR) .................. 10-2014-0098523
Sep. 30, 2014 (KR) .................. 10-2014-0132068

(51) Int. Cl.
*G06F 3/041* (2006.01)
*G11C 19/28* (2006.01)
(Continued)

(52) U.S. Cl.
CPC ........ *G06F 3/04164* (2019.05); *G06F 3/0412* (2013.01); *G09G 3/2092* (2013.01);
(Continued)

(58) Field of Classification Search
CPC ...... G06F 3/041; G06F 3/0412; G06F 3/0416; G06F 3/044; G06F 3/047; G09G 3/36;
(Continued)

(56) References Cited

U.S. PATENT DOCUMENTS 5,519,344 A * 5/1996 Proebsting ........... G11C 7/1051
326/17
6,316,301 B1 * 11/2001 Kant ...................... G06F 17/505
257/288
(Continued)

FOREIGN PATENT DOCUMENTS

CN    102682692 A    9/2012
CN    102804253 A    11/2012
(Continued)

OTHER PUBLICATIONS

PCT International Search Report, PCT/KR2015/008006, dated Nov. 11, 2015, 2 pages.
(Continued)

*Primary Examiner* — Alexander Eisen
*Assistant Examiner* — Nelson Lam
(74) *Attorney, Agent, or Firm* — Fenwick & West LLP

(57) ABSTRACT

A display device of the present invention includes a display panel having gate lines and a shift register configured to provide gate pulses to the gate lines. The shift register includes: a node control circuit controls potentials of a Q node and QB node in response to a gate start pulse or an output from a previous stage; a reset circuit configured to receive an output control signal at a first voltage level during a non-display period, and with a output control signal at a second voltage level during a display period, so that the output control signal is output to an output terminal according to the potentials of the Q node and the QB node or the output terminal is discharged; and a gate pulse output unit
(Continued)

configured to include a first output unit configured to provide a first output signal to an output terminal connected to the gate line, by reversing an output of the node control circuit, and a second output unit configured to invert an output of the node control circuit and provide a second output signal having a phase different from a phase of the first output signal.

19 Claims, 12 Drawing Sheets

(51) Int. Cl.
*G09G 3/36* (2006.01)
*G09G 3/20* (2006.01)

(52) U.S. Cl.
CPC ........... *G09G 3/3677* (2013.01); *G11C 19/28* (2013.01); *G09G 3/3648* (2013.01); *G09G 2300/08* (2013.01); *G09G 2310/0267* (2013.01); *G09G 2310/0286* (2013.01); *G09G 2310/0289* (2013.01); *G09G 2310/0291* (2013.01); *G09G 2310/061* (2013.01); *G09G 2310/08* (2013.01)

(58) Field of Classification Search
CPC .. G09G 3/3611; G09G 3/3625; G09G 3/3674; G09G 3/3677; G09G 3/3681
USPC ..................................... 345/87–104, 173–179
See application file for complete search history.

(56) References Cited

U.S. PATENT DOCUMENTS

| | | | |
|---|---|---|---|
| 8,462,098 B2 | 6/2013 | Tobita | |
| 8,654,057 B2 | 2/2014 | Tobita | |
| 9,070,471 B2 | 6/2015 | Furuta et al. | |
| 2004/0145389 A1* | 7/2004 | Yu | H03K 19/09432 326/115 |
| 2005/0156859 A1* | 7/2005 | Jang | G09G 3/20 345/100 |
| 2006/0007085 A1* | 1/2006 | Kim | G09G 3/3677 345/87 |
| 2008/0238852 A1* | 10/2008 | Tsai | G09G 3/20 345/98 |
| 2010/0134476 A1* | 6/2010 | Zebedee | G09G 3/3677 345/214 |
| 2010/0201666 A1 | 8/2010 | Tobita | |
| 2011/0148497 A1* | 6/2011 | Ishii | H03K 19/0016 327/210 |
| 2012/0081346 A1* | 4/2012 | Furuta | G11C 19/28 345/209 |
| 2012/0086686 A1* | 4/2012 | Sasaki | G09G 3/3677 345/208 |
| 2012/0086703 A1* | 4/2012 | Yokoyama | G09G 3/3655 345/215 |
| 2012/0105395 A1* | 5/2012 | Hachida | G11C 19/28 345/204 |
| 2013/0077736 A1 | 3/2013 | Son | |
| 2013/0222220 A1 | 8/2013 | Tobita | |
| 2014/0044228 A1* | 2/2014 | Jang | G11C 19/00 377/64 |
| 2014/0050294 A1 | 2/2014 | Cao et al. | |
| 2014/0079175 A1 | 3/2014 | Wu | |
| 2014/0098017 A1* | 4/2014 | Murakami | G11C 19/28 345/100 |
| 2014/0117358 A1 | 5/2014 | Tobita | |
| 2014/0347284 A1* | 11/2014 | Lee | G06F 3/041 345/173 |
| 2015/0187313 A1* | 7/2015 | Lee | G09G 3/3674 345/100 |
| 2017/0116911 A1* | 4/2017 | Shim | G09G 3/2092 |
| 2018/0366067 A1* | 12/2018 | Jang | G09G 3/3674 |

FOREIGN PATENT DOCUMENTS

| | | |
|---|---|---|
| CN | 102915698 A | 2/2013 |
| CN | 103093825 A | 5/2013 |
| JP | 2010-049767 A | 3/2010 |
| JP | 2014-127221 A | 7/2014 |
| JP | 2014-134805 A | 7/2014 |
| KR | 10-2010-0116098 A | 10/2010 |
| KR | 10-2011-0123459 A | 11/2011 |
| KR | 10-2013-0017281 A | 2/2013 |

OTHER PUBLICATIONS

PCT Written Opinion, PCT/KR2015/008006, dated Nov. 11, 2015, 5 pages.
European Extended Search Report, European Application No. 15827469.6, dated Feb. 2, 2018, 10 pages.
First Office Action, Chinese Patent Application No. 201580041227.3, dated Jan. 23, 2019, 16 pages.

* cited by examiner

DISPLAY DEVICE WITH SHIFT REGISTER COMPRISING NODE CONTROL CIRCUIT FOR Q AND QB NODE POTENTIALS AND RESET CIRCUIT

TECHNICAL FIELD

The present invention relates to a display device.

BACKGROUND ART

The display device is configured such that data lines and gate lines are intersecting each other and pixels are arranged in matrix. The data lines are supplied with video data voltages to be displayed, and the gate lines are sequentially supplied with gate pulses. Pixels on a display line, to which gate pulses are supplied, are supplied with video data voltages, and all display lines are sequentially scanned by gate pulses to thereby display video data.

In general, a scan driving circuit, which is used to supply gate pulses to gate lines of a flat display device, includes a plurality of gate Integrated Circuits (ICs). Since each gate drive IC needs to output gate pulses sequentially, each gate drive IC may basically include a shift register, and may include output buffers and circuits used to adjust an output voltage of the shift register according to driving characteristics of a display panel.

Driving the gate drive ICs is related to scanning horizontal lines and is significantly important to drive the display device, and thus, it is required to drive the gate drive ICs accurately and stably. In order to drive the gate drive ICs stably, each shift register includes a reset circuit (RESET) for resetting a node voltage of a node control circuit (NCON), and a control circuit (CONTROL) for preventing a gate pulse from outputting due to an error, as shown in FIG. 1. The reset circuit (RESET) and the control circuit (CONTROL) are driven by a low-potential voltage (VSS) and a high-potential voltage (VDD), respectively, and each of the reset circuit (RESET) and the control circuit (CONTROL) utilizes four transistors.

Recently, a shift register of a gate drive IC is formed on a panel in order to simplify the structure of a driving drive IC, but a reset circuit (RESET) and a control circuit (CONTROL), which are included in the shift register, may increase the size of a bezel that is a non-display area of the panel. Such a disadvantage becomes severe when a display panel has a large screen or high resolution, and therefore, the above method is hard to apply to a large-screen/high-resolution display panel which has recently gained popularity.

In addition, a gate pulse output from a scan driving circuit generally swings between a gate low voltage (VGL) and a gate high voltage (VGH). As the difference between the gate low voltage (VGL) and the gate high voltage (VGH) increases, more power consumption may be required at a time when a gate pulse swings. To solve this problem, Gate Pulse Modulation (GPM) has been proposed for causing the voltage to be smoothly changed at a time when a gate pulse falls. As such, modulating a waveform of a clock signal corresponding to an output of a gate pulse is generally used to cause a voltage to be smoothly changed at a time when a gate pulse falls.

However, a display device, in which a shift register of a scan driving circuit utilizes an input of an output unit as a constant high-potential voltage, cannot control a voltage variance of the high-potential voltage and therefore it is not possible to control a voltage variance at a time when a gate pulse falls.

DISCLOSURE

Technical Problem

The present invention is to provide a display device which minimizes an additional semi-conductive device and is capable of driving a gate driving unit stably.

The present invention is to provide a display device which outputs a gate pulse using a high-potential voltage so as to make a gradient gentle at a time when a voltage of the gate pulse falls.

Technical Solution

A display device of the present invention includes a display panel having gate lines and a gate driving circuit configured to provide gate pulses to the gate lines. The gate driving circuit includes: a node control circuit controls potentials of a Q node and QB node in response to a gate start pulse or an output from a previous stage; a reset circuit configured to receive an output control signal at a first voltage level during a non-display period, and with a output control signal at a second voltage level during a display period, so that the output control signal is output to an output terminal according to the potentials of the Q node and the QB node or the output terminal is discharged; and a gate pulse output unit configured to include a first output unit configured to provide a first output signal to an output terminal connected to the gate line, by reversing an output of the node control circuit, and a second output unit configured to invert an output of the node control circuit and provide a second output signal having a phase different from a phase of the first output signal.

Advantageous Effects

A shift register of the present invention controls a scan pulse so that it is not output at an undesired timing by using a reset signal which separates a display period and a non display period from each other, such that a scan driving operation can be stably performed while reducing the number of transistors. In addition, the present invention is able to reset output terminals of shift resisters all at once with a reset signal for an operation preparation period, thereby further enhancing reliability of the scan driving operation.

As such, compared with the conventional reset circuit, the present invention performs a resetting procedure without increasing the number of transistors, thereby reducing the area occupied by the shift register in a panel and therefore resulting in a display device that is advantageous to apply to a display panel having a great number of pixels per inch (PPI).

The display device of the present invention is able to generate output signals having different delay values, based on outputs of node control circuits, and synthesize the output signals to make a gradient gentle at a time when a voltage falls. As such, the present invention is able to have the same effects as those of GPM by use of output signals having different phases, and thus, the present invention can be applied to a display device which generates a gate pulse using a high-potential voltage.

BEST MODE

Hereinafter, embodiments of the present invention are described in detail with reference to the accompanying drawings in the case where the present invention is implemented as a liquid display device.

Figure 1:
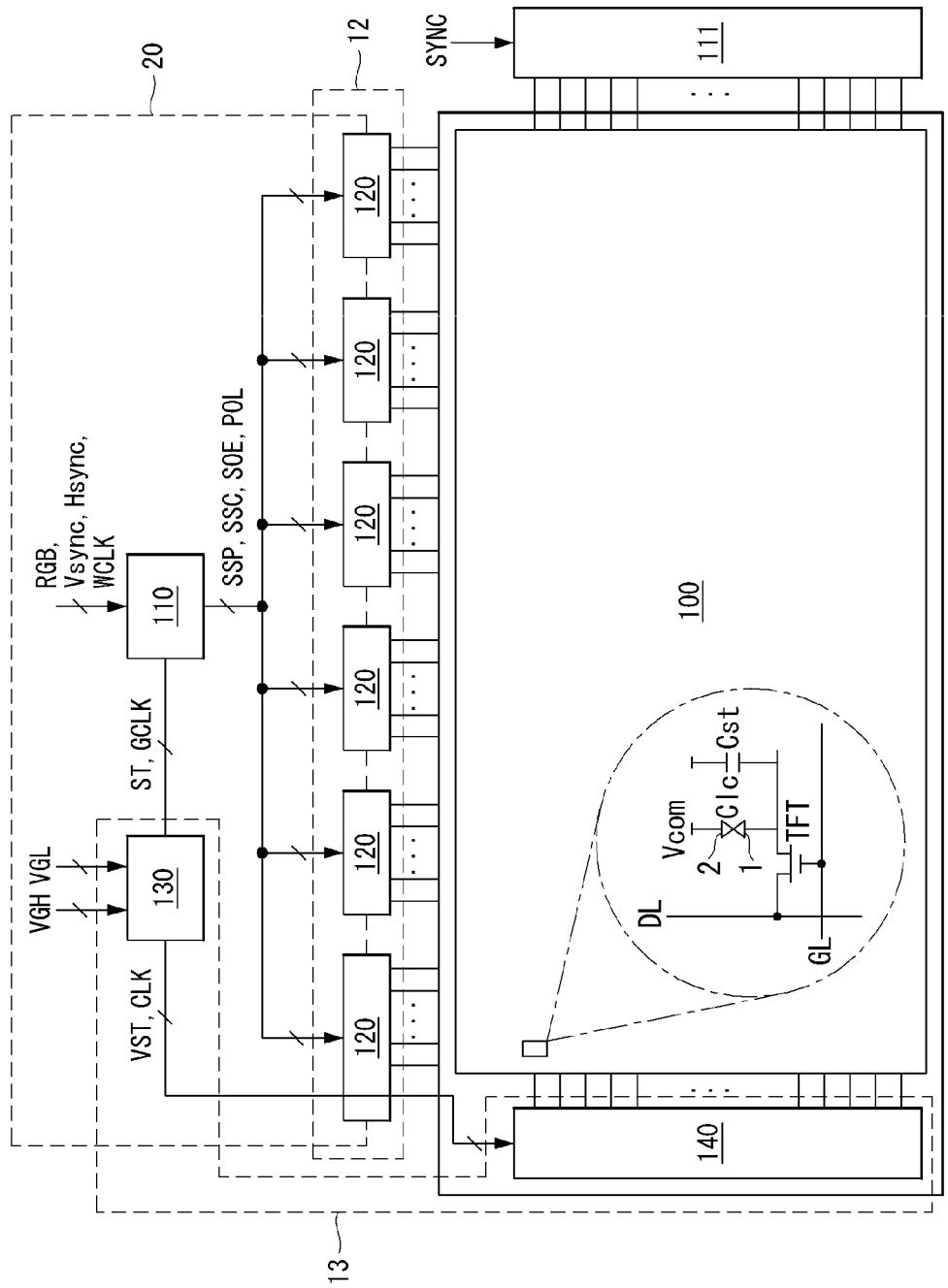
FIG. 1 is a block diagram illustrating a display device according to an embodiment of the present invention.

FIG. 1 is a block diagram illustrating a display device according to an embodiment of the present invention. Referring to FIG. 1, a display device according to the present invention includes a display panel 100, a timing controller 110, a touch sensing circuit 111, a data driving circuit 12, and a scan driving circuit 13.

The display panel 100 may be configured as a liquid display panel in which a liquid layer is between two substrates. One of the two substrates may be a Thin Film Transistor (TFT) array substrate, and the other one may be a color filter substrate including a color filter, a black matrix element, etc. However, the structure of the display panel 100 is not limited thereto, and the color filter and the black matrix element may be formed on the TFT array substrate.

The TFT array substrate includes data lines DL, gate lines DL intersecting the data lines DL, and pixels P arranged in matrix.

A plurality of Thin Film Transistors (TFTs), pixel electrodes 1 for charging data voltages to pixels, and storage capacitors connected to the pixels to maintain a pixel voltage are formed at intersections between the data lines (DL) and the gate lines (GL). A liquid cell of each pixel is driven by an electric field and configured to adjust transmittance of incident light, wherein the electric field is applied according to a difference between a data voltage applied to a pixel electrode 1 and a common voltage applied to a common electrode 2. The TFTs are turned on in response to gate pulses transmitted along the gate lines, and supply the pixel electrodes 1 with voltages transmitted along data lines (DL). The common electrode 2 may be formed on a lower substrate or an upper substrate. The common electrode 2 may be divided into a plurality of blocks, each configured to act as a self-capacitance or mutual-capacitance touch sensor which senses capacitance change which occurs due to a touch (or proximity) input.

The data driving circuit 12 includes a plurality of source drive ICs 120. The source drive ICs 120 receive digital video data (RGB) from the timing controller 110. The source drive ICs 120 generate a data voltage by converting the digital video data (RGB) into a gamma compensation voltage in response to a source timing control signal from the timing controller 110, and supply the data voltage to data lines of the display panel 100 to be synchronized with a gate pulse. The source drive ICs 120 may be connected to the data lines of the display panel 100 by a Chip On Glass (COG) process or a Tape Automated Bonding (TAB) process.

The scan driving circuit 13 includes a level shifter 130 connected between the timing controller 110 and the gate lines of the display panel 100, and a gate shift register 140.

The level shifter 130 performs level-shifting on a Transistor-Transistor-Logic (TTL) logic level voltage of the i-th phase gate shift clocks (CLK1~CLKi) received from the timing controller 110 between a gate high voltage (VGH) and a gate low voltage (VGL). Hereinafter, embodiments of the present invention are described by taking an example of using four-phase gate shift clocks (CLK1 to CLK4).

The gate shift register 140 is composed of stages which shifts gate start pulses (VST) in accordance with the gate shift clocks (CLK1 to CLK4) to output a carry signal and a gate pulse (Gout) sequentially.

The scan driving circuit may be formed directly on a lower substrate of the display panel 100 in a Gate In Panel (GIP) structure. In the GIP structure, the level shifter 130 may be mounted on a Printed Circuit Board (PCB) 20, and the gate shift register 140 may be mounted on the lower substrate of the display panel 100.

The timing controller 110 receives digital video data (RGB) from an external host computer through an interface, such as a Low Voltage Differential Signaling (LVDS) interface and a Transition Minimized Differential Signaling (TMDS) interface. The timing controller 110 transmits the digital video data (RGB), received from the host computer, to the source drive ICs 120.

The timing controller 110 receives timing signals, such as a vertical synchronization signal (Vsync), a horizontal synchronization signal (Hsync), a data enable signal (DE), and a main clock (MCLK), from a system unit through the LVDS or TMDS interface reception circuit. The timing controller 110 generates timing control signals with reference to timing signals from a system for controlling operation timings of a data driving circuit and a scan driving circuit. The timing control signals include scan timing control signals for controlling operation timings of the scan driving circuit, and data timing control signals for controlling operation timings of the source drive ICs 120 and polarity of data voltages.

The scan timing control signal includes a gate start pulse (VST), the gate shift clocks CLK1 to CLK4, a Gate Output Enable (GOE) signal, etc. The gate start pulse (VST) is input to the gate shift register 140 to control a shift start timing. The gate shift clocks CLK1 to CLK4 are level-shifted by the level shifter 130, and then input to the gate shift register 140 to be used as a clock signal for shifting the gate start pulse (VST). The GOE signal controls an output timing of the gate shift register 140.

The data timing control signal includes a source start pulse (SSP), a source sampling clock SSC, a polarity control signal (POL), a source output enable signal (SOE), etc. The source start pulse (SSP) controls shift start timings of the source drive ICs 120. The source sampling clock (SSC) is a clock signal for controlling a sampling timing of data at a rising or falling edge of the source sampling clock SSC in the source drive ICs 120.

The touch sensing circuit 111 samples a mutual-capacitance voltage received through reception lines Rx of a touch screen panel, and accumulates the sampled voltage in the integrator's capacitor. The touch sensing circuit 111 converts the voltage charged in the integrator's capacitor into digital data, compares the data with a preset threshold value, and, if the data is equal to or greater than the threshold value, determines that the data is mutual-capacitance data at a location of a touch (or proximity) input.

Figure 2:
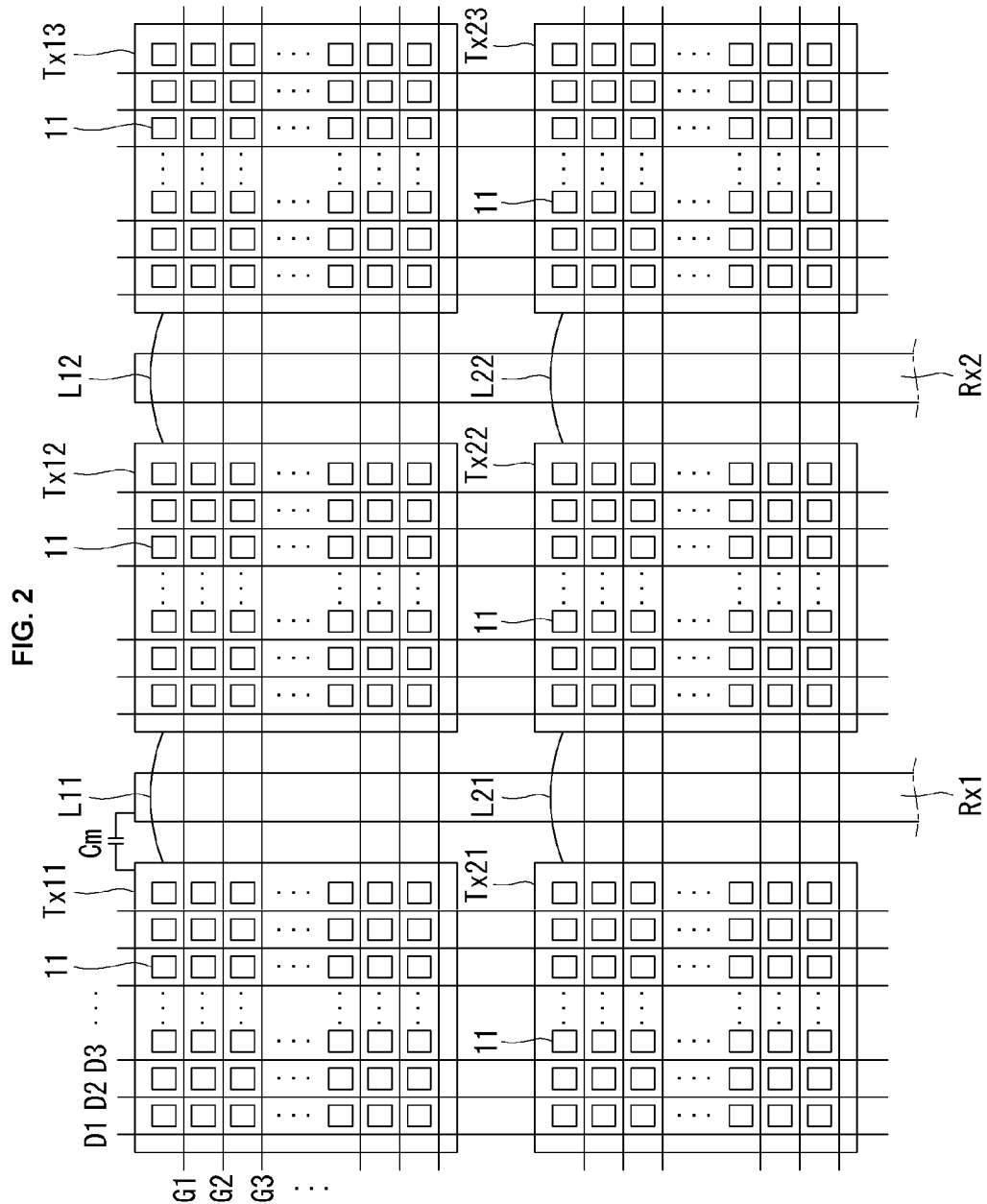
FIG. 2 and FIG. 3 are diagrams illustrating a touch screen according to an embodiment of the present invention.
Figure 3:
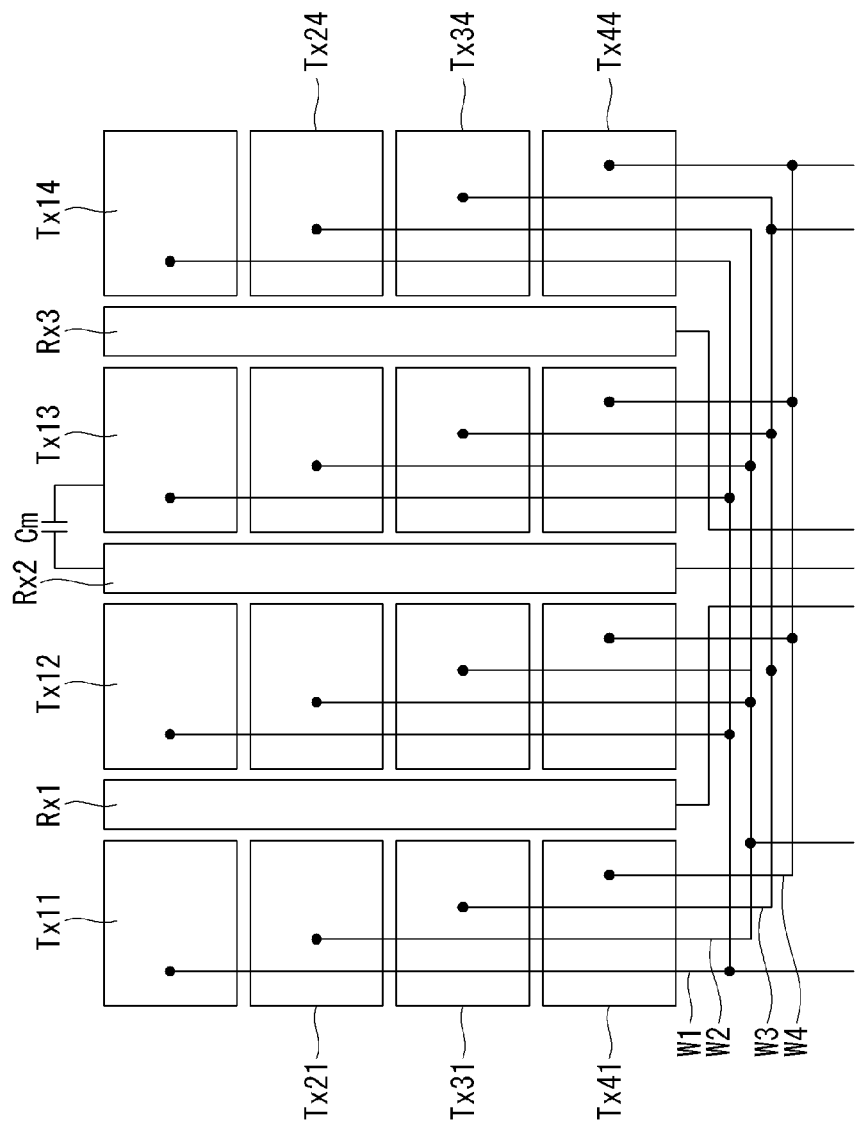

FIGS. 2 and 3 are plan views illustrating examples of a pixel array of a display panel including an in-cell touch screen.

FIG. 2 is a plan view of a wiring structure of a touch screen (TSP), the view in which a mutual-capacitance touch screen (TSP) and part of a pixel array are enlarged. Referring to FIG. 2, the mutual capacitance touch screen (TSP) includes Tx lines connecting common electrode blocks (hereinafter, referred to as Tx blocks) which are connected in a horizontal direction, and common electrode blocks (hereinafter, referred to as Rx lines) which are extended in a vertical direction. A mutual capacitance (Cm) is formed at every intersection between the Tx lines and the Rx lines (Rx1 and Rx2).

The Tx blocks arranged in the horizontal direction are connected by link patterns L11 to L22. Each of Tx blocks (Tx11 to Tx23) overlaps the pixel electrodes with an insulating layer therebetween. Each of the Tx blocks (Tx11 to Tx23) may be formed of a transparent conductive material, such as an Indium Thin Oxide (ITO). The link patterns L11 to L22 cross the Rx lines Rx1 and Rx2 to be electrically connected to the Tx blocks (Tx 11 to Tx 23) which are adjacent in the horizontal direction. The link patterns (L11 to L22) may overlap the Rx lines Rx1 and Rx2 with insulating layers therebetween. The link patterns (L11 to L22) may be formed of a metal with a high level of electrical conductivity, such as aluminum (Al), aluminum neodymium (AlNd), molybdenum (Mo), chrome (Cr), copper (Cu), and silver (Ag).

The Rx blocks (Rx1 and Rx2) are extended along a vertical direction of the display panel 100. The Rx blocks (Rx1 and Rx2) may be formed of a transparent conductive material, such as ITO. Each of the Rx blocks (Rx1 and Rx2) may overlap a plurality of pixels which are not shown. The Rx blocks (Rx1 and Rx2) may be formed on the upper substrate or the lower substrate of the display panel 100.

FIG. 3 is a plan view illustrating the structure of a pixel array of an in-cell-type mutual capacitance touch screen according to another embodiment. Referring to FIG. 3, the mutual capacitance touch screen according to another embodiment includes vertically connected Tx blocks (Tx 11 to Tx 44), and Rx electrodes. The vertically connected Tx blocks (Tx 11 to Tx 44) are connected to each other by routing wirings W1 to W4, thereby forming a Tx line, and the Rx electrodes Rx1 to Rx3 are formed vertically between the Tx lines.

In the mutual capacitance touch screen (TSP) shown in FIGS. 2 and 3, the Tx blocks (Tx 11 to Tx 23) and the Rx blocks (Rx1 and Rx2) operate as common electrodes for a display period of the display panel, and operate as mutual capacitance sensors for a touch sensor operation period during a non-display period. Thus, a common voltage (Vcom) for charging pixels is supplied to each block for the display period of the display panel, and a signal for driving a mutual capacitance sensor is supplied to each block for the touch sensor operation period.

In FIGS. 2 and 3, the common electrode blocks are depicted as Tx and Rx touch lines of a mutual capacitance-type touch screen (TSP). However, in some other embodiments, the common electrode blocks may be configured as a self capacitance-type touch screen (TSP) which recognizes a touch input by detecting a change in capacitance of each common electrode block.

Pixels in the display panel 100 are charged with data voltages at each frame to output an image. One frame period includes a display period and a non-display period. The display period is a period for charging pixels of the display panel 100 with image data of a corresponding frame, and the non-display period is a black period which is between the end of charging pixels of the display panel 100 and the start of recharging the pixels with image data of a next frame. Before the display panel 100 is supplied with image data of continuous frames, an operation preparation period for resetting the scan driving circuit 13 of the display panel 100 may exist.

Figure 4:
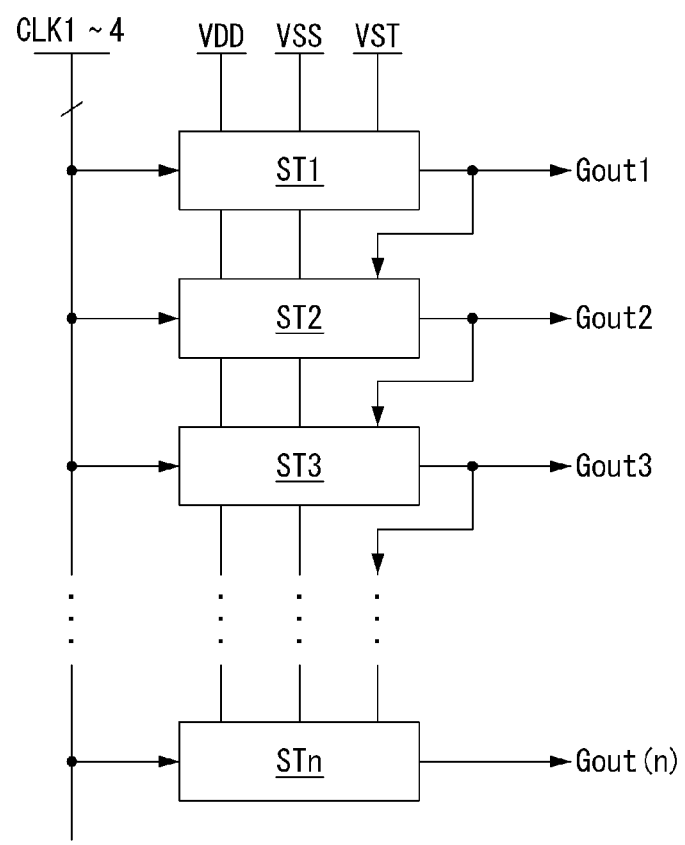
FIG. 4 is a diagram illustrating a shift register according to an embodiment of the present invention.

FIG. 4 is a schematic diagram illustrating the shift register 140 according to an embodiment of the present invention.

Referring to FIG. 4, the gate shift register 140 is composed of a plurality of dependently connected stages (ST1 to STn) (n is an integer equal to or greater than 2), and configured to output the first to n-th gate pulses (Gout(1) to Gout)(n)) sequentially. At a time when a gate pulse output from each stage is applied to a gate line of a display device, the gate pulse acts as a carry signal which is delivered to a front-end stage and a rear-end stage. In the following description, the "front-end stage" indicates a location above a referenced stage. For example, with reference to the i-th stage STi (i is a natural number greater than 1 and smaller than n), the front-end stage indicates one of the first stage ST1 to the (i−1)-th stage (ST(i−1)). The "rear-end stage" indicates a location below a referenced stage. For example, with reference to the i-th stage (STi), the rear-end stage indicates one of the (i+1)-th stage (ST(i+1)) to the n-th stage.

Figure 5:
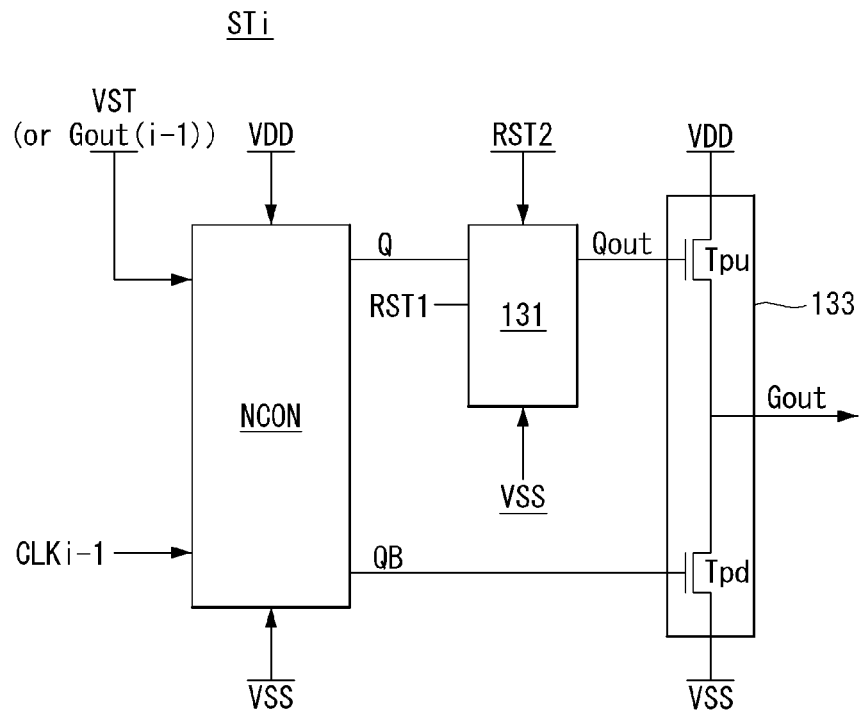
FIG. 5 is a diagram illustrating a shift register stage according to an embodiment of the present invention.

FIG. 5 is a diagram illustrating an example of the structure of the i-th stage shown in FIG. 3.

Referring to FIG. 5, the i-th stage (STi) includes a node control circuit (NCON), a reset circuit 131, and a gate pulse output unit 133.

The node control circuit (NCON) controls a voltage of Q node or QB node by receiving a start pulse (VST) or an output of a previous stage. For example, a node control circuit (NCON) of the first stage ST2 may receive a start pulse (VST), and a scan pulse output through a gate pulse output unit 133 of the first stage ST1 may be input to a node control circuit (NCON) included in one rear-end stage (e.g., ST2) among rear-end stages of the first stage (ST1). That is, a node control circuit (NCON) of the i-th stage (STi) receives the (i−1)-th clock signal (CLK(i−1)) to charge or discharge Q node of the i-th stage (STi). Description about the following embodiment is provided on the assumption that the node control circuit (NCON) of the i-th stage (STi) receives the (i−1)-th clock signal (CLK(i−1)) to charge a Q node of the i-th stage. By using a voltage output from an output terminal (Qout), a reset circuit 131 controls the output unit 133 to or not to output a gate pulse. For example, the reset circuit 131 discharges the output terminal (Qout) to a low-potential voltage (VSS) so that the gate pulse output unit 133 is controlled not to output a gate pulse, while outputting a high-level voltage so that the gate pulse output unit 133 is controlled to output a gate pulse.

As described above, before image data is supplied to the display panel 100, an operation preparation period for resetting the scan driving circuit 13 may exist. Throughout this specification, the operation preparation period indicates a period in which a first reset signal (RST1) is received to reset a potential of an output terminal (Qout) of each stage (ST).

Within the operation preparation period, the reset circuit 131 is supplied with a reset signal (RST1) at a high-level voltage to discharge an output voltage of the output terminal (Qout) at a low-potential voltage (VSS). In more detail, when the reset signal (RST1) is at a low-level voltage and the Q node (Q) is at a high voltage, the output terminal (Qout) of the reset circuit 131 is discharged at the low-potential voltage (VSS), thereby resetting the potential of the stage.

On the other hand, when the reset signal (RST1) is at a low level voltage, and the Q node (Q) is at a low voltage, the reset circuit 131 outputs a output control signal (RST2). The output control signal (RST2) is maintained at different voltage levels between the non-display period and the display period. The output control signal (RST2) is maintained at a first voltage level during the non-display period, and at a second voltage level during the non-display period. The first voltage level is a potential which does not cause the gate pulse output unit 133 to operate, and the second voltage level is an electric potential which causes the gate pulse output unit 133 to operate. For example, the first voltage level may be a low-level voltage, and the second voltage level may be a high-level voltage. Thus, even though the reset signal (RST1) is at a low level, the reset circuit 131 outputs an output control signal (RST2) having the first voltage level through the output terminal (Qout) during the non-display period, which does not cause the gate pulse output unit 133 to operate. That is, during the non-display period, regardless of a potential of the Q node (Q) and the QB node (QB), the output terminal (Qout) of the reset circuit 131 is maintained at the first voltage level which causes the gate pulse output unit 133 to not operate. Thus, it is possible to prevent a gate pulse from being output from the gate pulse output unit 133 due to noise which may occur in the Q node (Q) or the QB node (QB) during the non-display period.

As such, by discharging the electrical potential of the output terminal (Qout) of the reset circuit 131, the reset circuit 131 not just performs a resetting operation, but presents a gate pulse from being output during the non-display period. The conventional gate shift register controls outputting of a gate pulse according to the change in an electrical potential of the Q node (Q), so an additional circuit needs to be added to limit outputting of a gate pulse during the non-display period. However, the reset circuit 131 of the present invention utilizes a single circuit to reset a stage during a operation preparation period and control outputting of a gate pulse during the non-display period.

In other words, without an additional circuit structure, the reset circuit 131 of the present invention performs the primary resetting operation to stabilize a potential of the output terminal (Qout). In addition, the reset circuit 131 may perform the secondary stabilizing operation to prevent a gate pulse from being output from the gate pulse output unit 133, by varying a voltage level of a driving power for the reset circuit 131 during each of the display period and the non-display period. Regarding this, detailed structure and operation of the reset circuit 131 will be described later.

The gate pulse output unit 133 includes a pull-up transistor (Tpu) and a pull-down transistor (Tpd). The gate pulse output unit 133 outputs a gate pulse (Gout) according to a potential of the output terminal (Qout) of the reset circuit 131. The gate pulse output unit 133 does not output a gate pulse when the output terminal (Qout) of the reset circuit 131 is at a low-potential voltage: however, the gate pulse output unit 133 outputs a gate pulse when the output terminal (Qout) of the reset circuit 131 is at a high-potential voltage, as shown in FIG. 5. In addition, the gate pulse output unit 133 discharges an output voltage to a low-potential voltage (VSS) in response to a potential of the QB node (QB) controlled by the node control circuit (NCON). For example, the gate pulse output unit 133 discharges an output voltage to a low-potential voltage (VSS) when a potential of the QB node (QB) is at a high-potential voltage.

The gate pulse output unit 133 may be configured differently from the structure shown in FIG. 5. For example, the gate pulse output unit 133 may control outputting of a gate pulse (Gout) by using only a voltage of the Q node (Q). Generally, the QB node (QB) is used to prevent a gate pulse (Gout) from being output at an undesired timing due to an unstable potential of the Q node (Q) or complexity of the node control circuit (NCON). In other words, the QB node (QB) is used to forcibly discharge a voltage of the gate pulse output unit 13 in periods except for a period in which a gate pulse (Gout) is output. However, each stage of the gate shift register 140 described in this specification includes the reset circuit 131 having an output terminal (Qout) of which potential is efficiently stabilized by an output control signal (RST2) that has different voltage levels for a display period and for a non-display period. Thus, even without an additional QB node (QB) in the gate pulse output unit 133, it is possible to stabilize a timing of a gate pulse (Gout).

Figure 6:
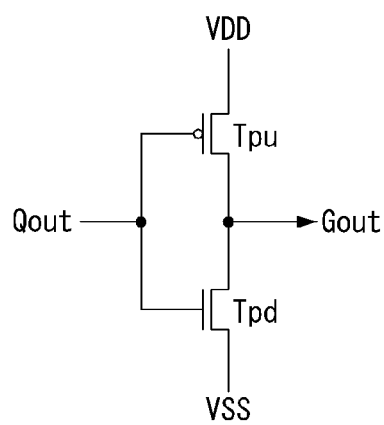
FIG. 6 is a diagram illustrating an example of a gate pulse output unit.

For example, referring to FIG. 6, the gate pulse output unit 133 according to an embodiment includes a pull-up transistor (Tpu) and a pull-down transistor (Tpd). In response to a low level voltage applied from the output terminal (Qout) of the reset circuit 131, the pull-up transistor (Tpu) outputs a driving voltage (VDD), supplied through a drain electrode, to the gate pulse (Gout). In response to a high level voltage of the output terminal (Qout), the pull-down transistor (Tpd) discharges a voltage of the gate pulse output unit 133 to a low-potential voltage (VSS).

Figure 7:
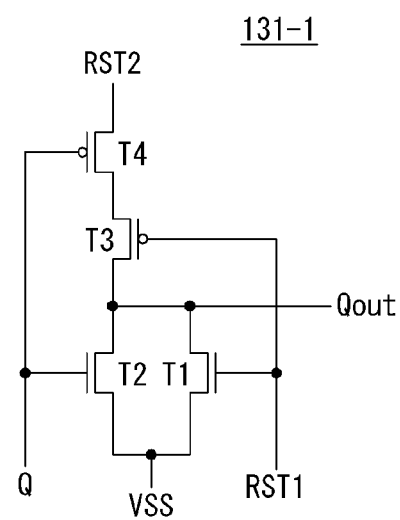
FIG. 7 is a circuit diagram illustrating a reset circuit according to a first embodiment of the present invention.
Figure 8:
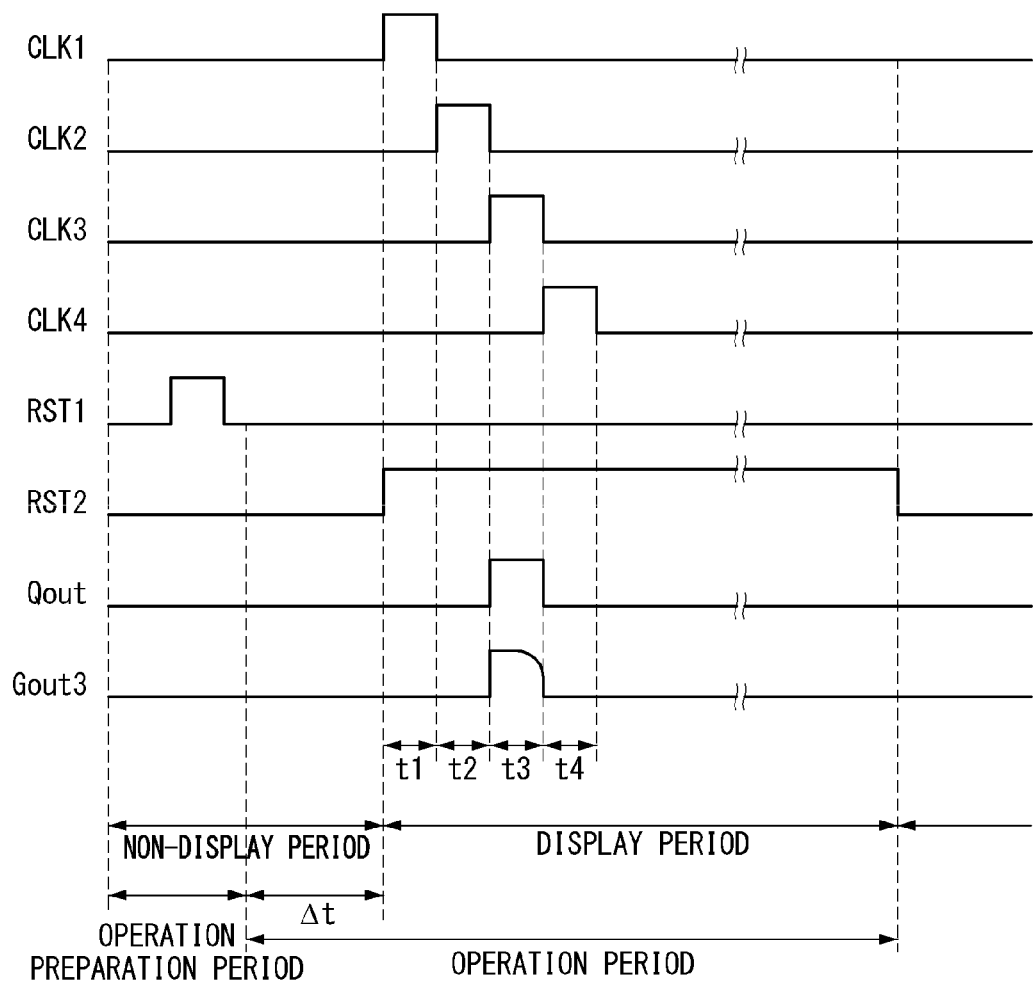
FIG. 8 is a waveform view showing input and output signals of a stage.

FIG. 7 is a circuit diagram illustrating a reset circuit according to an embodiment, and FIG. 8 shows input and output signals of stages (ST1 to STn). How the reset circuit 131 performs resetting operation and output stabilization operation and how the stages (ST1 to STn) outputs gate pulses are described in conjunction with FIGS. 4 to 8.

A reset circuit 131-1 shown in the embodiment of FIG. 7 is connected between the node control circuit (NCON) and the gate pulse output unit 133. The node control circuit (NCON) and the reset circuit 131-1 are connected by the Q node (Q). An output terminal (Qout) of the reset circuit 131-1 is connected to the gate pulse output unit 133. By receiving a voltage of the Q node (Q) and a reset signal (RST1), the reset circuit 131-1 outputs a low-potential voltage (VSS) or an output control signal (RST2) to the output terminal (Qout). The reset circuit 131-1 according to the first embodiment outputs the output control signal (RST2) when a potential of the Q node (Q) and the reset signal (RST1) are all at a low level.

To this end, the reset circuit 131-1 includes first to fourth transistors T1, T2, T3, and T4 which constitutes an NOR gate structure. That is, the first transistor T1 discharges a potential of the output terminal (Qout) to a low-potential voltage (VSS) when the reset signal (RST1) input to a gate electrode is at a high level. The second transistor T2 is connected to the first transistor in parallel, and discharges a potential of the output terminal (Qout) to a low-potential voltage (VSS) when the Q node (Q) connected to a gate electrode is at a high level. The third and fourth transistor T4 are connected in serial, and the third transistor T3 is turned on when the reset signal (RST1) is at a low level, whereas the fourth transistor T4 is turned on when the Q node (Q) is at a low level. When the third and fourth transistors T4 are turned on at the same time, the output control signal (RST2) is output to the output terminal via the third transistor T3.

As illustrated in FIG. 8, when power is provided through a system (now shown), a display device has an operation preparation period for a specific time. When a specific time Δt has elapsed after the operation preparation period, a display period starts, in which a data input signal (DE) and clock signals (CLK) are input to display an image. During a non-display period, a touch signal may be received or additional information other than image data may be received.

The reset circuit 131-1 receives a reset signal (RST1) at a high level for a predetermined time of the operation preparation period. In response to the reset signal (RST1) at the high level, the first transistor (T1) discharges the potential of the output terminal (Qout) to the low-potential voltage (VSS). At this point, even if the fourth transistor (T4) is turned on by the potential of the Q node (Q), the third transistor (T3) is turned off by the reset signal (RST1) at the high level, and thus, the output control signal (RST2) is not provided to the output terminal (Qout). That is, while the reset signal (RST1) is applied during the operation preparation period, the reset signal 131 discharges the potential of the output terminal (Qout) to the low-potential voltage (VSS), regardless of the potential of the Q node (Q).

After the resetting operation is performed, the reset signal (RST1) swings to a low-level voltage. Then, the reset signal (RST1) is maintained at the low level in the non-display period before the clock signals (CLK1 to CLK4) are received. In the non-display period after the resetting operation, the third transistor (T3) is turned on by the low-level reset signal (RST1). Because a gate pulse is not output in the non-display period, the node control circuit (NCON) controls the potential of the Q node (Q) to be at a high level voltage. Therefore, in response to the high-potential voltage of the Q node (Q), the second transistor T2 of the reset circuit 131 discharges the potential of the output terminal (Qout) to the low-potential voltage (VSS). If the fourth transistor is turned on when the third transistor (T3) is turned on by the low-level reset signal (RST1), the output control signal (RST2) is output to the output terminal (Qout) via the third and fourth transistors (T4). However, because the output control signal (RST2) is at a low level voltage in the non-display period, the gate pulse output unit 133 does not output a gate pulse. That is, even if the potential of the Q node (Q) becomes unstable due to an abnormal operation or noise, the reset circuit 131-1 supplies the output control signal (RST2) of a low level potential to the gate pulse output unit 133 to turn on the pull-down transistor, so that a gate pulse is prevented from being output.

As described above, during the operation preparation period, the reset circuit 131-1 performs a primary resetting operation to discharge the output terminal (Qout) of the reset circuit 131-1 to the low-potential voltage (VSS), regardless of the potential of the Q node (Q). In addition, during the non-display period, the reset circuit 131-1 prevents outputting of a gate pulse based on the low-level output control signal (RST2).

As such, the reset circuit 131-1 according to the first embodiment utilizes a single logic circuit to discharge the potential of the output terminal, or outputs the output control signal (RST2) which has a different voltage level in each of the display period and the non-display period. In particular, the output control signal (RST2) separates the display period and the non-display period from each other, and the output control signal (RST2) input to the reset circuit 131-1 in the non-display period is maintained at a voltage level at which the gate pulse output unit 133 does not operate. Thus, resetting the stages (ST1 to STn) in the operation preparation period and preventing outputting of a gate pulse in the non-display period may be done by a single logic circuit. Thus, compared to the conventional technology where a circuit for a resetting operation and a circuit for preventing outputting of a gate pulse are individually configured, it is possible to further simplify the structure of the shift register 140 and reduce the number of required semi-conductive elements. As such, the reset circuit 131 having a simple structure may make it possible to reduce not just manufacturing costs, but the size of the circuit, and therefore, reduce the entire size of the shift register 140. That is, the display device of the present invention may reduce the size of a bezel which is a non-display area of a panel, so it is advantageous in using a large-screen/high-resolution display panel.

In the display period, the level shifter 130 shifts logic-level voltages of four-phase gate shift clocks (CLK1 to CLK4), received from the timing controller 100, between the gate high voltage (VGH) and the gate low voltage (VGL) to thereby generate a circulating clock in which the first to fourth gate shift clocks (CLK1 to CLK4) are delayed sequentially. In the display period, the reset signal (RST1) is maintained at a low voltage level, whereas the output control signal (RST2) swings from the low level to the high level. While the gate shift clocks are not provided for a time of the display period, the node control circuit (NCON) of the first stage ST1 discharges a voltage of the Q node (Q) in response to a gate start pulse (VST). To this end, the node control circuit (NCON) is switched by the gate start pulse (VST), and may include a transistor (not shown) which connects the Q node (Q) and an input terminal of the low-potential voltage (VSS).

Because the reset signal (RST1) and the potential of the Q node (Q) are at a low-potential voltage level during the display period, the third and fourth transistors (T4) included in the reset circuit 131 of the first stage (ST1) is turned on and the output control signal (RST2) at a high level voltage is output to the output terminal (Qout). In response to the high-level output control signal (RST2) provided from the reset circuit 131, the gate pulse output unit 133 of the first stage (ST1) outputs a first gate pulse (Gout1).

For example, the third stage (ST3) outputs a third gate pulse (Gout3) in the following procedure. After first and second gate pulses are respectively output in a first horizontal period t1 and in a second horizontal period t2, the node control circuit (NCON) maintains the Q node (Q) at a low-potential voltage during a third horizontal period t3. In response to a third gate shift clock (GCLK3), the node control circuit (NCON) discharges the Q node (Q). When the Q node (Q) is at the low-potential voltage, the reset circuit 131 outputs the output control signal (RST2) at a high level voltage. The pull-up transistor (Tpu) of the scan pulse output unit 133 is turned on by the output control signal (RST2) to thereby output the third gate pulse (Gout3) at a high-potential voltage.

MODE FOR INVENTION

Figure 9:
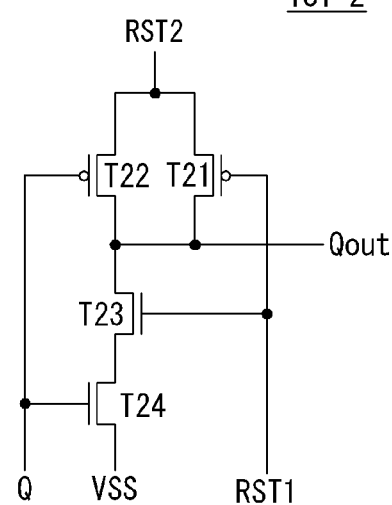
FIGS. 9-11 are circuit diagrams illustrating reset circuits according to second to fourth embodiments of the present invention.
Figure 10:
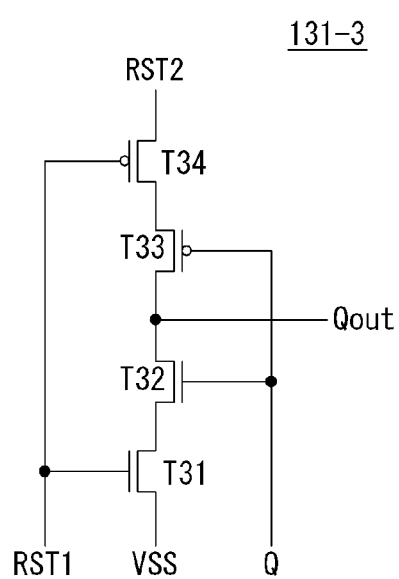

FIGS. 9 and 10 are diagrams illustrating reset circuits according to the second and third embodiments. The reset circuits according to the second and third embodiments may perform the same operation as described in the first embodiment by a driving waveform shown in FIG. 8.

A reset circuit 131-2 according to the embodiment shown in FIG. 9 is connected to a Q node (Q) of a node control circuit (NCON), and an output terminal (Qout) of the reset circuit 131-2 is connected to a gate pulse output unit 133. By receiving a voltage of the Q node (Q) and a reset signal (RST1), the reset circuit 131-2 outputs an output control signal (RST2) to the output terminal (Qout) or discharges a potential of the output terminal (Qout) to a low-potential voltage (VSS). If the voltage of the Q node (Q) and the reset signal (RST1) are all at a high level, the reset circuit 131-2 discharges the potential of the output terminal (Qout) to the low-potential voltage (VSS).

To this end, the reset circuit 131-2 includes first to fourth transistors (T21 to T23) which forms an NOR gate structure. The first transistor (T21) outputs an output control signal (RST2), which is received through a source electrode, to the output terminal (Qout) through a drain electrode when a reset signal (RST1) input to a gate electrode is at a low level. The second transistor (T22) is connected to the first transistor (T21) in parallel, and outputs an output control signal (RST2), which is received through a source electrode, to the output terminal (Qout) through a drain electrode when the Q node connected to a gate electrode is at a low level. The third and fourth transistors (T23 and T23) are connected to each other in serial, and the third transistor (T23) is turned on when a reset signal is at a high level, whereas the fourth transistor (T24) is turned on when the Q node (Q) is at a high level. When the third and fourth transistors (T23 and T24) are turned on at the same time, the reset circuit 131-2 discharges the potential of the output terminal (Qout) to the low-potential voltage (VSS).

A reset circuit 131-3 according to the embodiment shown in FIG. 10 is connected to a Q node (Q) of a node control circuit (NCON), and an output terminal (Qout) of the reset circuit 131-3 is connected to a gate pulse output unit 133. By receiving a voltage of the Q node (Q) and a reset signal (RST1), the reset circuit 13101 outputs an output control signal (RST2) to the output terminal (Qout) or discharges a potential of the output terminal (Qout) to a low-potential voltage (VSS).

The reset circuit 131-3 includes first to fourth transistors (T31 to T34) which are connected to each other in serial. The first transistor (T31) is turned on in response to a high level reset signal (RST1), and the second transistor (T32) is turned on by a high level potential of the Q node (Q). The first and second transistors (T31 and T32) are adjacent to each other and connected in serial, and the potential of the output terminal (Qout) is discharged to the low-potential voltage (VSS) when the reset signal (RST1) and the potential of the Q node (Q) are all at the high level. The third transistor (T33) is turned on in response to a low-level of the Q node (Q), and the fourth transistor (T34) is turned on only by a low-level potential of the reset signal (RST1). The first to fourth transistors (T31, T32, T33, and T34) are all connected in serial, and when the reset signal (RST1) and the potential of the Q node are all at the low level, the output control signal (RST2) is output to the output terminal (Qout).

Figure 11:
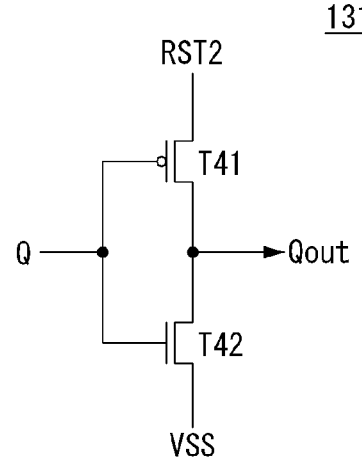

A reset circuit 131-4 according to the embodiment shown in FIG. 11 does not use a reset signal (RST1), and other driving forms are the same as shown in FIG. 8.

The reset circuit 131-4 includes a first transistor (T41), which outputs an output control signal (RST2) to an output terminal (Qout) in response to a low-potential voltage of a Q node (Q), and a second transistor T42 which discharges the output terminal (Qout) to a low-potential voltage (VSS) in response to a high-potential voltage of the Q node. During a non-display period, the node control circuit (NCON) may maintain the Q node (Q) at the high-potential voltage so as to discharge the output terminal (Qout) to the low-potential voltage (VSS). Even if the first transistor (T41) is turned on because the potential of the Q node (Q) becomes unstable because of an abnormal operation of the node control circuit (NCON) or occurrence of noise, the output control signal (RST2) may have, during a non-display period, a voltage at which a scan pulse is not set to be output from a scan pulse output unit 133. Therefore, it is possible to prevent a gate pulse (Gout) from being output from the gate pulse output unit 133 during the non-display period due to an abnormal operation of the Q node.

As described in the above embodiments, the output control signal (RST2) is maintained at a low level during an operation preparation period. That is, even in a section of the operation preparation period in which a reset signal (RST1) is not applied, the reset circuit 131-4 may prevent the gate pulse output unit 133 from outputting a gate pulse (Gout), based on an output control signal (RST2) whose voltage level is variable.

At a time when a voltage level of the gate pulse is inverted during a procedure in which the shift register 140 outputs a gate pulse, a ripple may occur in a common voltage (Vcom). Because the ripple affects a voltage difference between the common electrode (Vcom) and an pixel electrode, it evidently has an impact on luminance of a pixel P.

The size of the ripple is disproportionate to the load of the common electrode (Vcom), and thus, even when luminance of pixels sharing the same common electrode (Vcom) is changed by the ripple, the change in the luminance is not very different among the pixels. However, if the common voltage (Vcom) is separated into a plurality of blocks, each block of the common electrode may have different load and different size of ripple. That is, due to the ripple, there may be deviation of luminance among pixels of corresponding blocks of a common electrode, the blocks which have different loads. For example, in a display device having an in-cell touch sensor function, a common electrode of a display panel 100 consists of a plurality of blocks, wherein some of the blocks form a Tx electrode and other blocks forms an Rx electrode, and wherein each block of the common electrode may have a different size and a different load. Thus, due to the difference in the size of a common electrode ripple, the Tx electrode and the Rx electrode, which have different loads, have different luminance, thereby resulting in block dimming. A detailed description thereof is provided below.

As illustrated in FIGS. 2 and 3, in a touch screen structure, blocks of the common electrode (Vcom), which compose a Tx line (Tx), and blocks of the common electrode (Vcom), which composes a Rx line (Rx), may be formed in a different size (width) or may receive a different load due to structures adjacent to the Tx block (Tx) and the Rx electrode (Rx). In addition, some blocks of the common electrode (Vcom), which composes the Tx block (Tx) and the Rx block (Rx), may be formed using materials having different resistance values, and there may be difference in the load among blocks of the common electrode (Vcom).

Accordingly, when ripples occur in the common voltage (Vcom), pixels in the Tx block (Tx) and pixels in the Rx electrode (Rx) are affected by different-sized ripples. Due to the difference in ripple voltages, luminance variation between the pixels in the Tx block (Tx) and luminance variation of the pixels in the Rx block (Rx) become different. That is, block dimming is caused by the difference in luminance variation between the Tx block (Tx) and the Rx electrode (Rx).

To eliminate the block dimming, the gate shift register 140 modulates an output of a gate pulse.

Figure 12:
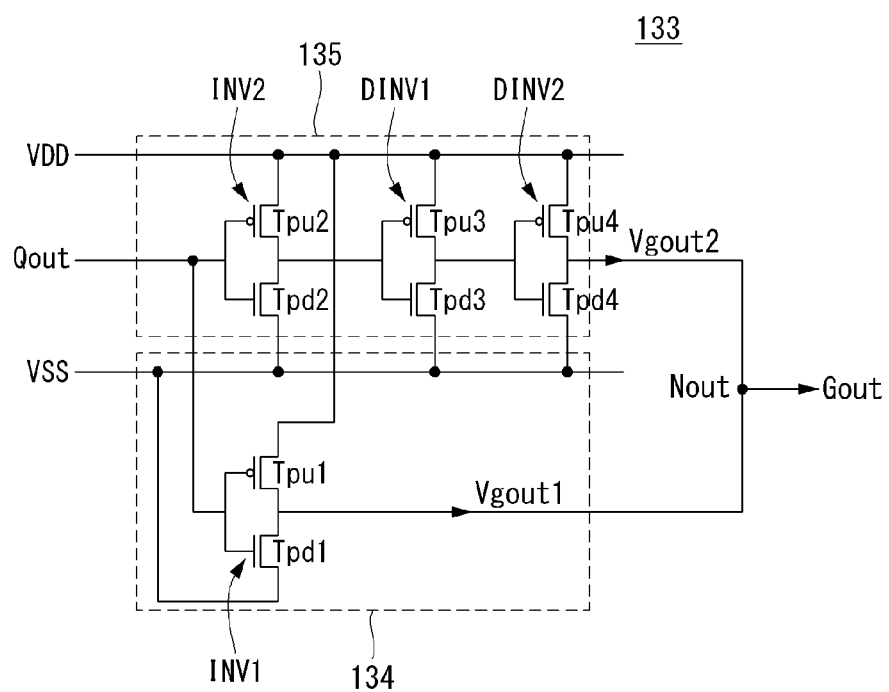
FIG. 12 is a diagram illustrating an example of a gate pulse output unit according to an embodiment of the present invention.

FIG. 12 is a diagram illustrating an example of the gate pulse output unit 133 of the shift register 140 for the purpose of elimination of a block dimming.

Referring to FIG. 12, the gate pulse output unit 133 includes first and second output units 134 and 135. The first output unit 134 includes a first inverter (INV1) which converts an output signal supplied through the output terminal (Qout) of the reset circuit 131. The first inverter (INV1) includes a first pull-up transistor (Tpu1) and a first pull-down transistor (Tpd1), which are connected to each other in serial between a high-potential voltage (VDD) and a low-potential voltage (VSS). A gate electrode of the first pull-up transistor (Tpu1) and a gate electrode of the first pull-down transistor (Tpd1) are connected to the output terminal (Qout) of the reset circuit 131. Accordingly, the first output unit 134 outputs a first output signal at the high-potential voltage (VDD) only when the output terminal (Qout) is at a low-level potential.

The second output unit 135 includes a second inverter (INV2) for inverting an output signal of the output terminal (Qout) of the reset circuit 131, and first and second delay inverter (DINV1 and (DINV2)) for delaying an output signal of the second inverter (INV2).

The second inverter (INV2) includes a second pull-up transistor (Tpu2) and a second pull-down transistor (Tpd2), which are connected to each other in serial between a high-potential voltage and a low-potential voltage (VSS). A gate electrode of the second pull-up transistor (Tpu2) and a gate electrode of the second pull-down transistor (Tpd2) are connected to the output terminal (Qout) of the reset circuit 131. The second inverter (INV2) outputs an output signal at the high-potential voltage (VDD) when the output terminal (Qout) of the reset circuit 131 is at a low-level potential.

The first delay inverter (DINV1) is connected to the second inverter (INV2) in serial to invert and delay an output signal of the second inverter (INV2). The second delay inverter (DINV2) is connected to the first delay inverter (DINV1) in serial to output a second output signal (Vgout2) which is an inverted and delayed version of the output signal of the first delay inverter (DINV1). That is, when the output terminal (Qout) of the reset circuit 131 is at the low-level potential, the second output unit 135 outputs the second output signal (Vgout2) at the high-potential voltage (VDD), the second output signal (Vgout2) being delayed by the first and second delay inverters (DIVN1 and DIVN2).

FIG. 12 demonstrates an example in which two delay inverters are used, but the number of delay inverters may be chosen to be a random even number, so that phase of an output signal of the second inverter (INV2) is not inverted.

The first output signal (Vgout1) output from the first output unit 134 and the second output signal (Vgout2) output from the second output unit 135 are provided to a gate pulse output node (Nout) connected to a gate line (GL). The gate pulse output node (Nout) synthesizes the first and second output signals (Vgout1 and Vgout2).

Figure 13:
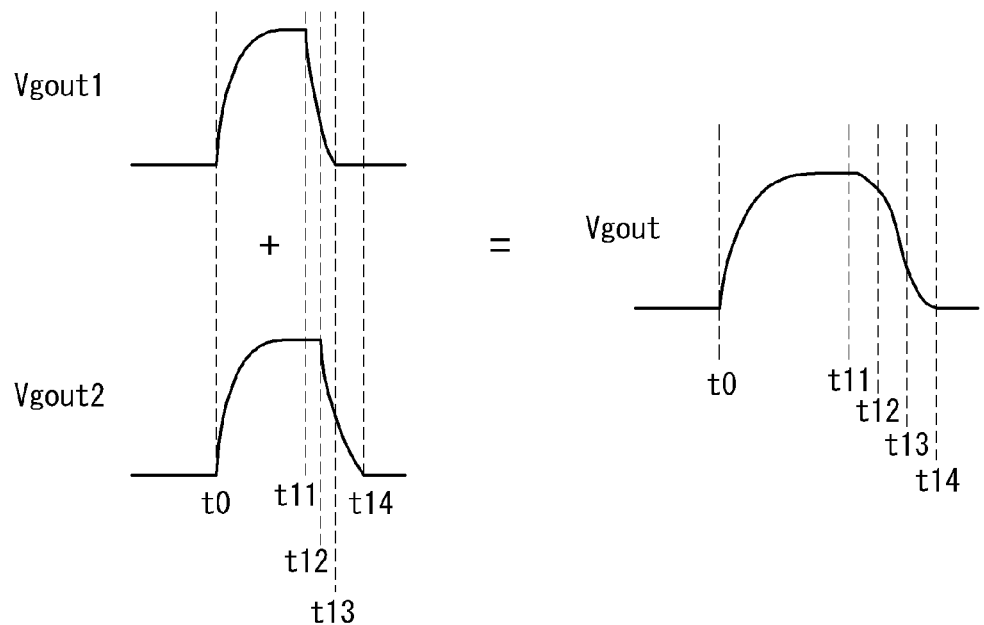
FIG. 13 is a diagram illustrating a procedure in which a gate pulse is generated.

As illustrated in FIG. 13, the first and second output signals (Vgout1 and Vgout2) have different phase. The first output signal (Vgout1) starts to rise at t0 until reaching the high-potential voltage (VDD). Then, the first output signal (Vgout1) starts to fall at t11 and is discharged at t13 to the low-potential voltage (VSS). The second output signal (Vgout2) starts to rise at t0 until reaching the high-potential voltage (VDD). The second output signal (Vgout2) starts to fall at t12 and is discharged at t14 to the low-potential voltage (VSS).

The first and second output signals (Vgout1 and Vgout2) are synthesized in the output node (Nout) and output as a gate pulse (Gout). Between t11 and t12, the second output signal (Vgout2) is maintained at the high-potential voltage (VDD), but the first output signal (Vgout1) is discharged, and therefore, the voltage level of the gate pulse (Gout) gradually falls from the high-potential voltage (VDD). Because the first and second output signals (Vgout1 and Vgout2) are all discharged between t12 and t13, the gate pulse (Gout) falls at a rate greater than the fall rate of voltage between t11 and t12. Between t13 and t14, the first output signal (Vgout1) is discharged and the second output signal (Vgout2) is still being discharged, and thus, the voltage of the gate pulse (Gout) falls at a rate corresponding to the discharge rate of the second output signal (Vgout2).

As such, a voltage of the gate pulse (Gout) falls at a different rate according to time. That is, if the gate pulse (Gout) is shown based on a voltage change over time, the falling gradient of the gate pulse (Gout) is different according to time. In particular, the second output signal (Vgout2) maintained at the high-potential voltage (VDD) for a certain period starting from t11 at which the gate pulse (Gout) start is synthesized with a signal of the output node (Nout), and therefore, it is possible to achieve a more gentle gradient at a time when the voltage of the gate pulse (Gout) starts to fall, compared to an existing technique. As such, it is possible to reduce the size of a ripple by making a difference of voltage levels small, and thus, the block dim may be eliminated from a display panel which employs a divided common electrode (Vcom). That is, according to the present invention, the common voltage ripple may become very small, so that luminance deviation caused by the common voltage ripple may be reduced in spite of the difference in resistance between the Tx block and the Rx electrode. As such, the gate pulse output unit 133 makes the voltage of the gate pulse (Gout) discharge at a relatively gentle speed, thereby the block dimming may be eliminated.

The falling gradient of the gate pulse (Gout) may be set by adjusting the number of delay inverters, and channel width and length of the delay inverters.

Figure 14:
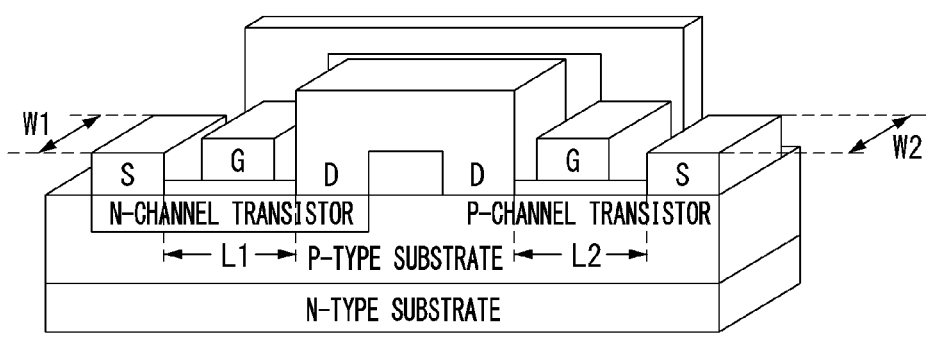
FIG. 14 is a cross-sectional perspective view of an inverter.

For example, the falling gradient of the gate pulse (Gout) may be adjusted using channel width and channel length of the delay inverters, as below. The falling gradient of the gate pulse (Gout) is a rate of the fall of a potential of the output node (Nout) through the pull-down transistor (Tpd). Hence, the rate of the fall of the gate pulse (Gout) in the output node (Nout) is proportional to channel width (W1) of the pull-down transistors (Tpd3 and Tpd4) of the first and second delay inverters (DINV1 and DINV2), and inversely proportional to channel length (L1) thereof. As shown in FIG. 14, it is because current flows smoothly when the channel width (W1) of the pull-down transistor (Tpd) is greater and when the channel length (L1) is short. Thus, the gradient at a time when the voltage of the gate pulse (Gout) falls may be set by adjusting the channel width (W1) and the channel length (L1) of the first and second delay inverters (DINV1 and DINV2).

In addition, the falling gradient of the gate pulse (Gout) may be adjusted using the number of delay inverters. The embodiment in FIG. 12 illustrates an example in which two inverters are used, but two or more delay inverters may be connected. In this case, the number of delay inverters may be an even number so that the phase of the second inverter is not inverted.

In addition, due to the falling gradient of the gate pulse (Gout), the first and second output units 134 and 135 may have different inverters without the need of an additional delay inverter. That is, each of the first and second output units 134 and 135 have the same number of inverters, each inverter which delays an output signal by a different time.

In the above embodiments of the present invention, the node control circuit (NCON), transistors of each of the reset circuits 131, 131-1, 131-2, 131-3, and 131-4, the first and second inverters (INV1 and INV2) of the scan pulse output unit 133, and the pull-up transistors (Tpu1 to Tpu4) and the pull-down transistors (Tpd1 to Tpd4) included in the delay inverters (DINV1 and DINV2) may be formed using one of an oxide transistor, an amorphous silicon transistor, or a low-temperature polycrystalline silicon transistor:

INDUSTRIAL APPLICABILITY

As such, compared to an existing reset circuit, the present invention provides a display device which performs a reset operation without increasing the number of transistors, thereby enabling a reduction in the size of a shift register in a panel and therefore being advantageous in being applied to a display panel having a great Pixel Per Inch (PPI).

By using output signals having different phases to have the same effect as that of GPM, the present invention is able to be applied to a display device which generates a gate pulse using a high-potential voltage.

What is claimed is:

1. A display device comprising:
    a display panel having gate lines; and
    a shift register, configured to supply gate pulses to the gate lines, the shift register comprising:
        a node control circuit that controls a potential of a Q node and a potential of a QB node in response to a gate start pulse or an output from a previous stage of the shift register;
        a reset circuit configured to:
            receive the potential of the Q node, a reset signal, an output control signal, and a low potential voltage, wherein the output control signal changes between a first level and a second level greater than the first level across time, the output control signal applied to a source electrode or a drain electrode of a transistor included in the reset circuit, but not to a gate electrode of the transistor,
            in response to a first value of the potential of the Q node and a first value of the reset signal, output the output control signal to an output terminal of the reset circuit, and
            in response to a second value of the potential of the Q node and a second value of the reset signal, output the low potential voltage to the output terminal of the reset circuit; and
        a gate pulse output unit configured to receive one of the output control signal or the low potential voltage from the output terminal of the reset circuit and output a gate pulse based on a value of the received one of the output control signal or the low potential voltage,
        wherein the output control signal is maintained at the first level during a non-display period, and at the second level during a display period,
        wherein the gate pulse output unit comprises:
            a first output unit configured to provide a first output signal to an output terminal connected to the gate line, by reversing an output of the reset circuit; and
            a second output unit configured to invert the output of the reset circuit and provide a second output signal having a phase different from a phase of the first output signal,
        wherein a first rising start point of the first output signal and a second rising start point of the second output signal are the same as each other,
        wherein a first falling start point of the first output signal is earlier than a second falling start point of the second output signal.

2. The display device of claim 1, wherein the reset circuit outputs the output control signal in response to a low-potential voltage of the Q node, while outputting the low-potential voltage to the gate pulse output unit in response to a high-potential voltage of the Q node in order to prevent the gate pulse from being output.

3. The display device of claim 2, wherein the reset circuit comprises:
    the transistor configured to output the output control signal to the output terminal in response to the potential of the Q node, and
    a second transistor configured to output the low potential voltage to the output terminal when a potential of the Q node is at a high level.

4. The display device of claim 2, wherein, for an operation preparation period, the reset circuit receives the reset signal and outputs a low-potential voltage in response to the reset signal.

5. The display device of claim 4, wherein the reset circuit is in a form of a NOR gate which outputs the output control signal when a potential of the Q node and the reset signal are all at a low level.

6. The display device of claim 4, wherein the reset circuit comprises:
    a first transistor configured to output the low-potential voltage, which is received through a source electrode, to a drain electrode when the reset signal input to a gate electrode is at a high level;
    a second transistor connected to the first transistor in parallel and configured to output the low-potential voltage, which is received through a source electrode, to a drain electrode when the Q node connected to a gate electrode is at a high level;
    a third transistor configured to be turned on when the reset signal input to a gate electrode is at a low level; and
    wherein the transistor is connected to the third transistor in serial and configured to, when the Q node is at a low level, be turned on to provide the output control signal, which is received through the source electrode, to the source electrode of the third transistor, thereby outputting the output control signal through the third transistor when the fourth transistor is turned on simultaneously with the third transistor.

7. The display device of claim 4, wherein the reset circuit is in a form of an NAND gate which outputs the low-potential voltage when a potential of the Q node and the reset signal are all at a high level.

8. The display device of claim 7, wherein the reset circuit comprises:
    a first transistor configured to output the output control signal, which is received through a source electrode, to a drain electrode when the reset signal input to a gate electrode is at a low level;
    the transistor connected to the first transistor in parallel and configured to output the output control signal, which is received through the source electrode, to a drain electrode when the Q node connected to a gate electrode is at a low level; and
    a third transistor configured to be turned on when the reset signal input to a gate electrode is at a high level; and a fourth transistor connected to the third transistor in serial and configured to, when the Q node connected to a gate electrode is at a high level, be turned on to supply the low-potential voltage, which is input to a source electrode, to the source electrode of the third transistor, thereby outputting the low-potential voltage through the third transistor when the fourth transistor is turned on simultaneously with the third transistor.

9. The display device of claim 1, wherein the reset circuit outputs the low potential voltage when a potential of the Q node and the reset signal are all at a high level, while outputting the output control signal when the potential of the Q node and the reset signal are all at a low level.

10. The display device of claim 9, further comprising:
first and second transistors which are connected to each other in serial and each of which outputs the low potential voltage in response to a high level potential of the Q node and the reset signal; and
a third transistor and the transistor which are connected to each other in serial and each of which outputs the output control signal in response to the low level of the reset signal and the low level of the potential of the Q node.

11. The display device of claim 1, wherein the second output unit controls the second output signal to fall at a later timing than a timing at which the first output signal starts to fall.

12. The display device of claim 11,
wherein the first output unit comprises a first inverter, and the second output unit comprises a second inverter, and
wherein the second inverter delays an output of the reset circuit further than an output of the first inverter.

13. The display device of claim 11,
wherein each of the first and second output units comprises inverters, and
wherein a number of inverters included in the second output unit is greater than a number of inverters included in the first output unit.

14. The display device of claim 13, wherein the number of inverters included in the second output unit is greater by 2k (k is a natural number) than the number of inverters included in the first output unit.

15. The display device of claim 1, wherein the first output signal and the second output signal are combined with each other at the output terminal to become the gate pulse,
wherein the gate pulse has a first falling gradient between the first falling start point and the second falling start point, and has a second falling gradient after the second falling start point, and
wherein the first falling gradient is smaller than the second falling gradient.

16. The display device of claim 1, wherein the display panel has common electrode blocks which have different sizes or different loads.

17. The display device of claim 16, wherein the common electrode blocks comprise:
a Tx block configured to be supplied with a common voltage during the display period, and with a touch driving signal during a touch sensor period; and
an Rx electrode configured to be supplied with the common voltage during the display period, and receive a charge during the touch sensor period.

18. The display device of claim 1, wherein the first and second output units use a high-potential voltage as a driving voltage.

19. The display device of claim 1, wherein whether the output control signal changes between the first level and the second level is not dependent on the potential of the Q node.

* * * * *